(12) United States Patent
Mori et al.

(10) Patent No.: US 10,260,165 B2
(45) Date of Patent: Apr. 16, 2019

(54) METHOD FOR MANUFACTURING NITRIDE CRYSTAL SUBSTRATE AND SUBSTRATE FOR CRYSTAL GROWTH

(71) Applicants: OSAKA UNIVERSITY, Suita-shi, Osaka (JP); SCIOCS COMPANY LIMITED, Hitachi-shi, Ibaraki (JP); SUMITOMO CHEMICAL COMPANY, LIMITED, Tokyo (JP)

(72) Inventors: Yusuke Mori, Suita (JP); Masashi Yoshimura, Suita (JP); Mamoru Imade, Suita (JP); Masayuki Imanishi, Suita (JP); Masatomo Shibata, Hitachi (JP); Takehiro Yoshida, Hitachi (JP)

(73) Assignees: Osaka University, Suita-shi, Osaka (JP); Sciocs Company Limited, Hitachi-shi (JP); Sumitomo Chemical Company, Limited, Tokyo (JP)

(*) Notice: Subject to any disclaimer, the term of this patent is extended or adjusted under 35 U.S.C. 154(b) by 0 days.

(21) Appl. No.: 15/398,319

(22) Filed: Jan. 4, 2017

(65) Prior Publication Data
US 2017/0191186 A1    Jul. 6, 2017

(30) Foreign Application Priority Data

Jan. 5, 2016 (JP) ................................. 2016-000354

(51) Int. Cl.
*C30B 25/18* (2006.01)
*C30B 19/12* (2006.01)
(Continued)

(52) U.S. Cl.
CPC ............ *C30B 25/186* (2013.01); *C30B 19/02* (2013.01); *C30B 19/12* (2013.01); *C30B 29/406* (2013.01);
(Continued)

(58) Field of Classification Search
CPC combination set(s) only.
See application file for complete search history.

(56) References Cited

U.S. PATENT DOCUMENTS 5,474,021 A * 12/1995 Tsuno ..................... C30B 25/02
117/101
2006/0226414 A1    10/2006 Oshima
(Continued)

FOREIGN PATENT DOCUMENTS

JP    2006-290676 A    10/2006

OTHER PUBLICATIONS

U.S. Office Action dated Dec. 17, 2018, for Copending U.S. Appl. No. 15/584,756.

*Primary Examiner* — Erin F Bergner
(74) *Attorney, Agent, or Firm* — Birch, Stewart, Kolasch & Birch, LLP

(57) ABSTRACT

There is provided a method for manufacturing a nitride crystal substrate, including: arranging a plurality of seed crystal substrates made of a nitride crystal in a planar appearance, so that their main surfaces are parallel to each other and their lateral surfaces are in contact with each other; growing a first crystal film using a vapor-phase growth method on a surface of the plurality of seed crystal substrates arranged in the planar appearance, and preparing a combined substrate formed by combining the adjacent seed crystal substrates each other by the first crystal film; growing a second crystal film using a liquid-phase growth method on a main surface of the combined substrate so as to be embedded in a groove that exists at a combined part of the seed crystal substrates, and preparing a substrate for crystal growth having a smoothened main surface; and growing a third crystal film using the vapor-phase growth method, on the smoothed main surface of the substrate for crystal growth.

9 Claims, 9 Drawing Sheets

(51) Int. Cl.
 *C30B 19/02* (2006.01)
 *C30B 29/40* (2006.01)
 *H01L 21/02* (2006.01)

(52) U.S. Cl.
 CPC .... *H01L 21/02002* (2013.01); *H01L 21/0254* (2013.01); *H01L 21/0262* (2013.01); *H01L 21/02389* (2013.01); *H01L 21/02428* (2013.01); *H01L 21/02625* (2013.01)

(56) References Cited

U.S. PATENT DOCUMENTS

| | | |
|---|---|---|
| 2009/0194848 A1 | 8/2009 | Uemura et al. |
| 2009/0236694 A1* | 9/2009 | Mizuhara ............... C30B 29/403 257/615 |
| 2010/0213576 A1* | 8/2010 | Hiranaka ............... B82Y 20/00 257/615 |
| 2010/0233870 A1* | 9/2010 | Oshima .................. C30B 25/00 438/478 |
| 2011/0260295 A1 | 10/2011 | Hirota et al. |
| 2015/0008563 A1 | 1/2015 | Mizuhara et al. |
| 2015/0203991 A1 | 7/2015 | Hashimoto et al. |

\* cited by examiner

METHOD FOR MANUFACTURING NITRIDE CRYSTAL SUBSTRATE AND SUBSTRATE FOR CRYSTAL GROWTH

BACKGROUND

Technical Field

The present invention relates to a method for manufacturing a nitride crystal substrate and a substrate for crystal growth.

Description of the Related Art

A substrate made of a nitride crystal such as gallium nitride for example (referred to as a nitride crystal substrate hereafter), is used when manufacturing a semiconductor device such as a light-emitting element and a high-speed transistor, etc. The nitride crystal substrate can be manufactured through the step of growing nitride crystals on a sapphire substrate or a substrate for crystal growth which is prepared using the sapphire substrate. In recent years, in order to obtain a nitride crystal substrate with a large diameter exceeding, for example, 2 inches, there is an increasing need for obtaining a substrate for crystal growth with a larger diameter (for example, see patent document 1).

Patent document 1: Japanese Patent Laid Open Publication No. 2006-290676

SUMMARY OF THE INVENTION

An object of the present invention is to provide a technique of increasing a diameter of a substrate for crystal growth, and manufacturing a high-quality nitride crystal substrate using such a large diameter substrate for crystal growth.

According to an aspect of the present invention, there is provided a method for manufacturing a nitride crystal substrate, including:

arranging a plurality of seed crystal substrates made of a nitride crystal in a planar appearance, so that their main surfaces are parallel to each other and their lateral surfaces are in contact with each other;

growing a first crystal film using a vapor-phase growth method on a surface of the plurality of seed crystal substrates arranged in the planar appearance, and preparing a combined substrate formed by combining the adjacent seed crystal substrates each other by the first crystal film;

growing a second crystal film using a liquid-phase growth method on a main surface of the combined substrate so as to be embedded in a groove that exists at a combined part of the seed crystal substrates, and preparing a substrate for crystal growth having a smoothened main surface; and growing a third crystal film using the vapor-phase growth method, on the smoothed main surface of the substrate for crystal growth.

According to other aspect of the present invention, there is provided a substrate for crystal growth, including:

a plurality of seed crystal substrates made of a nitride crystal arranged in a planar appearance, so that their main surfaces are parallel to each other and their lateral surfaces are in contact with each other;

a first crystal film formed using a vapor-phase growth method on a surface of the plurality of seed crystal substrates arranged in the planar appearance, and configured to combine the adjacent seed crystal substrates each other; and a second crystal film formed using a liquid-phase growth method on a main surface of the plurality of seed crystal substrates having the first crystal film formed thereon, and having a smoothened main surface by being embedded in a groove that exist at a combined part of the seed crystal substrates.

According to the present invention, it is possible to provide a technique of increasing a diameter of a substrate for crystal growth, and manufacturing a high-quality nitride crystal substrate using such a large diameter substrate for crystal growth.

DETAILED DESCRIPTION OF THE INVENTION

An Embodiment of the Present Invention

An embodiment of the present invention will be described hereafter, with reference to the drawings.

(1) Method for Manufacturing a Nitride Crystal Substrate

In this embodiment, explanation is given for an example of manufacturing a crystal substrate made of gallium nitride (GaN) crystals, as a nitride crystal substrate (referred to as a GaN substrate hereafter), by performing steps 1 to 6 shown below.

(Step 1: Preparation of Seed Crystal Substrates)

Figure 1A:
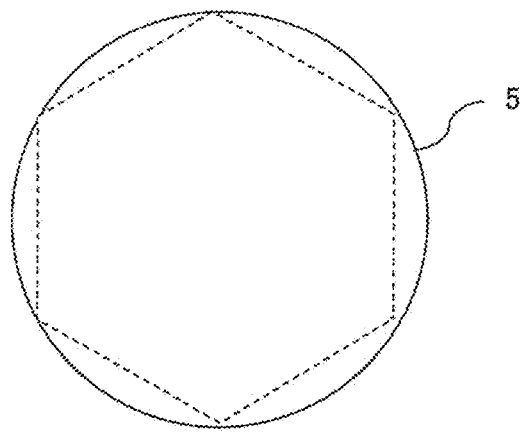
FIG. 1A is a planar view of a small diameter seed substrate used at the time of preparing a seed crystal substrate.
Figure 2A:
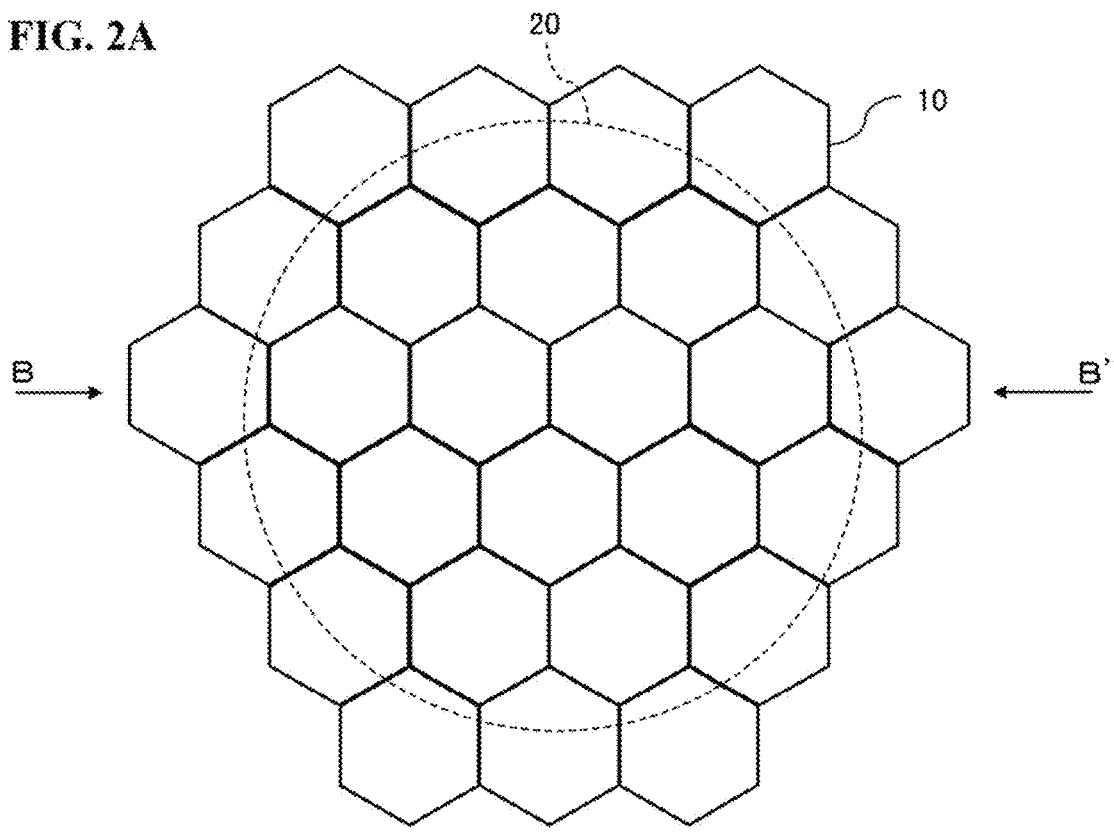
FIG. 2A is a planar view showing an example of an arrangement pattern of seed crystal substrates.

When the GaN substrate is manufactured, a substrate 20 for crystal growth (called a crystal growth substrate 20 hereafter) is used in this embodiment, the substrate 20 having an outer shape shown by a broken line for example in FIG. 2A. In this step, first, a plurality of small diameter seed substrates (crystal substrates) 5 made of GaN crystals and whose outer shape is shown by a solid line in FIG. 1A, are prepared as a base material used at the time of preparing seed crystal substrates 10 constituting the crystal growth substrate 20. Each small diameter seed substrate 5 is a circular substrate having an outer diameter larger than each diameter of the seed crystal substrates 10 to be prepared, and for example, can be prepared by epitaxially growing the GaN crystals on a ground substrate such as a sapphire substrate, etc., and cutting out grown crystals from the ground substrate and polishing the plane of the crystals. The GaN crystals can be grown using a publicly-known technique, irrespective of a vapor-phase growth method or a liquid-phase growth method. According to a current state of the art, when the substrate with a diameter of about 2 inches is used, a high quality substrate can be obtained at a relatively low cost, with a low defect density and a low impurity concentration, in which a variation of an off-angle, namely, a difference between a maximum value and a minimum value of the off-angle in its main surface (base surface for crystal growth), is for example 0.3° or less and relatively small. Here, the off-angle is defined as the angle between a normal line direction of the main surface of the small diameter seed substrate 5, and a main axis direction (the normal line direction of a low index surface closest to the main surface) of the GaN crystals constituting the small diameter seed substrate 5.

In this embodiment, as an example, explanation is given for a case of using a substrate with diameter D of about 2 inches and thickness T of 0.2 to 1.0 mm as the small diameter seed substrate 5. Further in this embodiment, explanation is given for the following case: a substrate in which the main surface, namely, the crystal growth surface of the small diameter substrate 5 is parallel to c-plane of the GaN crystal, or having an inclination within ±5°, preferably within ±1° with respect to this plane, is used as the small diameter seed substrate 5. Further, explanation is given for the following example in this embodiment: at the time of preparing a plurality of small diameter seed substrates 5, a substrate group in which the variation of the off-angle (difference between the maximum value and the minimum value of the off-angle) in the main surface of the plurality of small diameter seed substrates 5 is 0.3° or less and preferably 0.15° or less, and the variation of the off-angle (difference between the maximum value and the minimum value of the off-angle) among the plurality of small diameter seed substrates 5 is 0.3° or less and preferably 0.15° or less, is used as the plurality of small diameter seed substrates 5.

The term of "c-plane" used in this specification can include not only the c-plane of the GaN crystal, namely, a plane completely parallel to (0001) plane, but also a plane having a certain degree of inclination (vicinal) with respect to (0001) plane as described above. This point is also applied to a case of using the term of "a-plane" and "M-plane" in this specification. Namely, the term of "a-plane" used in this specification can include not only the a-plane of the GaN crystal, namely, a plane completely parallel to (11-20) plane, but also a plane having the similar inclination as the above inclination to this plane. Also, the term of "M-plane" used in this specification can include not only the M-plane of the GaN crystal, namely, a plane completely parallel to (10-10) plane, but also a plane having the similar inclination as the above inclination to this plane.

Figure 1B:
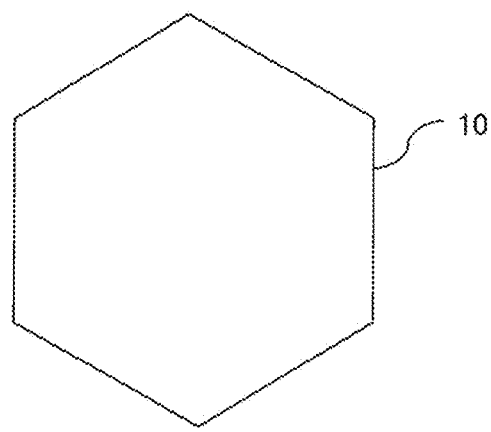
FIG. 1B is a planar view of the seed crystal substrate obtained from the small diameter seed substrate.
Figure 1C:
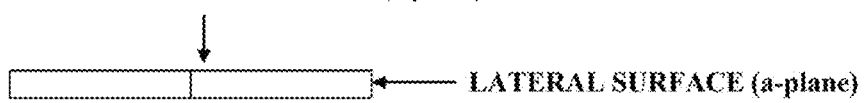
FIG. 1C is a lateral view of the seed crystal substrate.

When the small diameter seed substrate 5 is prepared, a seed crystal substrate 10 is obtained by removing a circumferential edge portion of the small diameter seed substrate 5, as shown in a planar configuration in FIG. 1B, and as shown in a lateral configuration in FIG. 1C. When the plurality of seed crystal substrates 10 are arranged on the same plane, a planar shape of the seed crystal substrates 10 is preferably a shape capable of forming a tessellation, that is, they can be laid over the surface without gaps. In this case, for the reason described later, it is preferable that all lateral surfaces of the seed crystal substrates 10 in contact with the lateral surfaces of other seed crystal substrates 10, namely, all surfaces opposed to (facing) the lateral surfaces of other seed crystal substrates 10 are the planes excluding M-plane, and are the planes in the same orientation each other (equivalent planes). For example, when the main surface (crystal growth surface) of the seed crystal substrates 10 is c-plane like this embodiment, it is preferable that all lateral surfaces of the seed crystal substrates 10 in contact with the lateral surfaces of other seed crystal substrates 10, are a-planes. The planar shape of each seed crystal substrate 10 is preferably an equilateral triangle, a parallelogram, a trapezoid, or a regular hexagon, or the like. If the planar shape of the seed crystal substrate 10 is a square or a rectangle, the following case occurs: when any one of the lateral surfaces of the seed crystal substrates 10 is a-plane, the lateral surface orthogonal to this plane inevitably becomes M-plane. If the planar shape of the seed crystal substrate 10 is circular or elliptical, the tessellation is impossible. Therefore, the lateral surfaces of the seed crystal substrates 10 cannot be the planes in the same orientation excluding M-plane.

(Step 2: Arrangement of the Seed Crystal Substrates)

When a plurality of seed crystal substrates 10 are obtained, step 2 is performed. In this step, a plurality of seed crystal substrates 10 made of GaN crystals are arranged in a planar appearance (tessellation), so that their main surfaces are parallel to each other and their lateral surfaces are in contact with each other.

FIG. 2A is a planar view showing an example of an arrangement pattern of the seed crystal substrates 10. When preparing the crystal growth substrate 20 having a circular planar shape whose outer shape is shown by a broken line in FIG. 2A, a circumferential edge portion (portion outside of the broken line) of the seed crystal substrate 10 (seed crystal substrate 10 that intersect with the broken line) constituting the circumferential edge portion of the crystal growth substrate 20, may be cut into an arc shape according to an outer shape of the crystal growth substrate 20. Such a cutting process may be performed before the seed crystal substrates 10 are assembled, or may be performed after assembly.

The description: "a plurality of seed crystal substrates 10 are arranged so that their main surfaces are parallel to each other" includes not only a case in which the main surfaces of the adjacent seed crystal substrates 10 are arranged completely in the same surface, but also a case in which there is a slight difference in the heights of these surfaces and a case in which these surfaces are arranged with a slight inclination with respect to each other. Namely this description shows a case in which a plurality of seed crystal substrates 10 are arranged so that the main surfaces of them are arranged in the same heights and in parallel to each other as much as possible. However, even in a case that there are differences in the heights of the main surfaces of the adjacent seed crystal substrates 10, the size of each difference is preferably set to 20 µm or less for example at largest, and more preferably set to 10 µm or less. Further, even in a case that an inclination occurs in the main surfaces of the adjacent seed crystal substrates 10, the size of the inclination is preferably set to 1° or less for example in the largest surface, and more preferably set to 0.5° or less. Further, when the plurality of seed crystal substrates 10 are arranged, the variation of the off-angle in the main surface (difference between a maximum value and a minimum value of the off-angle in the entire main surface) of the substrate group obtained by arranging the plurality of seed crystal substrates 10, is preferably set to 0.3° or less for example, and more preferably set to 0.15° or less. This is because if the variation is too large, there is sometimes a possibility of deteriorating the quality of the crystal grown in steps 3, 5 and 6 described later.

Further, the description: "a plurality of seed crystal substrates 10 are arranged so that their lateral surfaces are in contact with each other" includes not only a case in which the lateral surfaces of the adjacent seed crystal substrates 10 are completely in contact with each other without gaps, but also a case in which there are slight gaps between them. Namely, this description shows a case in which the plurality of seed crystal substrates 10 are opposed in proximity to each other so as not to allow the gap to occur between the lateral surfaces of them. However, even when the gap is generated between the lateral surfaces of the adjacent seed crystal substrates 10, the size of the gap in a room temperature condition is preferably set to 100 µm or less for example at largest, and more preferably set to 50 µm or less. This is because if the gap is too large, there is a case in which the adjacent seed crystal substrates 10 are not combined, or even in a case that they are combined, the strength of combining them is insufficient, when step 3 (crystal growth step) describe later is performed.

Figure 2B:
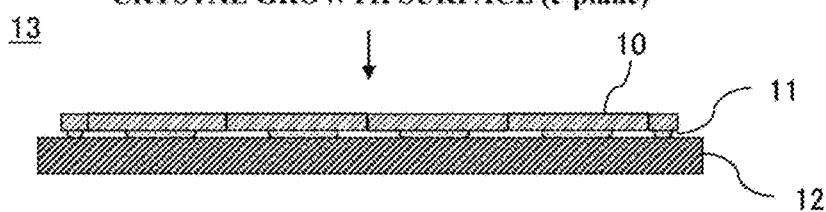
FIG. 2B is a cross-sectional view taken along the line B-B' of the group of the seed crystal substrates shown in FIG. 2A.

In order to facilitate handling in step 3 described later, a plurality of seed crystal substrates 10 are preferably fixed, for example on a holding plate (support plate) 12 formed as a flat plate. FIG. 2B shows a cross-sectional configuration of an assembled substrate 13 formed by bonding a plurality of seed crystal substrates 10 to the holding plate 12 using an adhesive agent 11. As shown in this figure, the seed crystal substrates 10 are placed on the holding plate 12 so that their main surfaces (crystal growth surfaces) are faced upward. The holding plate 12 and the adhesive agent 11 preferably have a heat resistance that withstands a film-forming temperature in a vapor-phase growth process of step 3 described later. Fixation of the seed crystal substrates 10 is not limited to the abovementioned method, and may be performed using a fixing jig, etc.

(Step 3: Combination by Vapor-Phase Growth)

Figure 3:
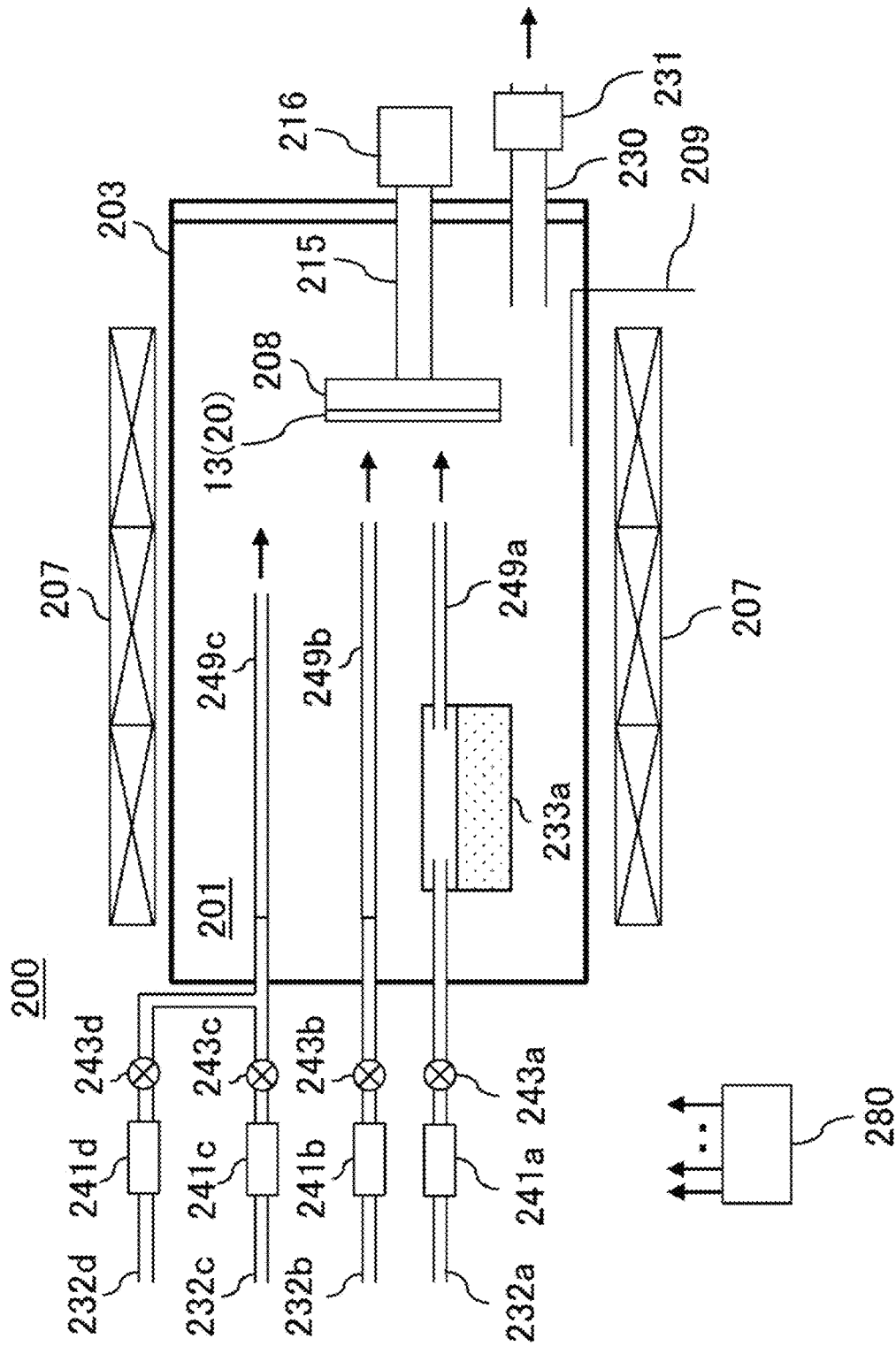
FIG. 3 is a schematic view of a vapor-phase deposition apparatus used when growing a first crystal film and a third crystal film.

When the adhesive agent 11 is solidified and preparation of the assembled substrate 13 is completed, GaN crystal film 14 which is a first crystal film (thin film for combination) is grown on the surface of the plurality of seed crystal substrates 10 arranged in a planar appearance, using a Hydride Vapor-phase Epitaxy apparatus (HVPE apparatus) 200 shown in FIG. 3.

The HVPE apparatus 200 is made of a heat-resistant material such as quartz, etc., and includes an airtight container 203 having a film-forming chamber 201 formed therein. A susceptor 208 for holding the assembled substrate 13 and the crystal growth substrate 20, is provided in the film-forming chamber 201. The susceptor 208 is connected to a rotating shaft 215 provided in a rotation mechanism 216, and configured to be rotatable. Gas supply pipes 232a to 232c for supplying hydrochloric acid (HCl) gas, ammonia ($NH_3$) gas, and nitrogen ($N_2$) gas into the film-forming chamber 201, is connected to one end of the air tight container 203. A gas supply pipe 232d for supplying hydrogen ($H_2$) gas is connected to the gas supply pipe 232c. Flow rate controllers 241a to 241d, and valves 243a to 243d are respectively provided on the gas supply pipes 232a to 232d sequentially from an upstream side. A gas generator 233a for containing Ga melt as a raw material, is provided on a downstream side of the gas supply pipe 232a. A nozzle 249a for supplying gallium chloride (GaCl) gas generated by a reaction between HCl gas and the Ga melt toward the assembled substrate 13, etc., held on the susceptor 208, is connected to the gas generator 233a. Nozzles 249b and 249c for supplying various gases supplied from these gas supply pipes toward the assembled substrate 13, etc., held on the susceptor 208, are respectively connected to the downstream side of the gas supply pipes 232b and 232c. An exhaust pipe 230 for exhausting inside of the film-forming chamber 201, is provided on the other end of the air tight container 203. A pump 231 is provided to the exhaust pipe 230. A zone heater 207 for heating the inside of the gas generator 233a and the assembled substrate 13, etc., held on the susceptor 208, to a desired temperature, is provided on an outer periphery of the air tight container 203, and a temperature sensor 209 for measuring a temperature inside of the film-forming chamber 201 is provided in the air tight container 203, respectively. Each member provided in the HVPE apparatus 200, is connected to a controller 280 configured as a computer, and is configured to control processing procedures and processing conditions described later, based on a program executed by the controller 280.

Step 3 can be performed using the abovementioned HVPE apparatus 200, for example by the following processing procedures. First, Ga polycrystal is put in the gas generator 233a as a raw material, and the assembled substrate 13 is placed on the susceptor 208. Then, $H_2$ gas (or mixed gas of $H_2$ gas and $N_2$ gas) is supplied into the film-forming chamber 201, while executing heating and exhausting the inside of the film-forming chamber 201. Then, gas supply is performed from the gas supply pipes 232a and 232b in a state in which the inside of the film-forming chamber 201 is set in a desired film-forming temperature and in a desired film-forming pressure, and in a state in which the inside of the film-forming chamber 201 is set in a desired atmosphere, and GaCl gas and $NH_3$ gas, which are film formation gases, are supplied to the main surface of the assembled substrate 13 (seed crystal substrates 10). Thus, as shown in the cross-sectional view of FIG. 4A, GaN crystal is epitaxially grown on the surface of the seed crystal substrates 10, and the GaN crystal film 14 is formed thereon. Owing to the formation of the GaN crystal film 14, the adjacent seed crystal substrates 10 are combined with each other by the GaN crystal film 14, and formed into an integral state. In order to prevent decomposition of the crystals constituting the seed crystal substrates 10 in the film formation process, $NH_3$ gas is preferably supplied prior to the HCl gas (for example before heating the inside of the film-forming chamber 201). Further, in order to increase in-plane uniformity of the film thickness of the GaN crystal film 14 and improve the strength of combining the adjacent seed crystal substrates 10 evenly in the surface, step 3 is preferably performed in a state of rotating the susceptor 208.

Step 3 is performed based on the following processing conditions for example:

Film-forming temperature (temperature of the assembled substrate): 980 to 1100° C., and preferably 1050 to 1100° C.

Film-forming pressure (pressure in the film-forming chamber): 90 to 105 kPa, and preferably 90 to 95 kPa Partial pressure of GaCl gas: 1.5 to 15 kPa Partial pressure of $NH_3$ gas/partial pressure of GaCl gas: 2 to 6

Flow rate of $H_2$ gas/flow rate of $N_2$ gas: 0 to 1

Figure 4:
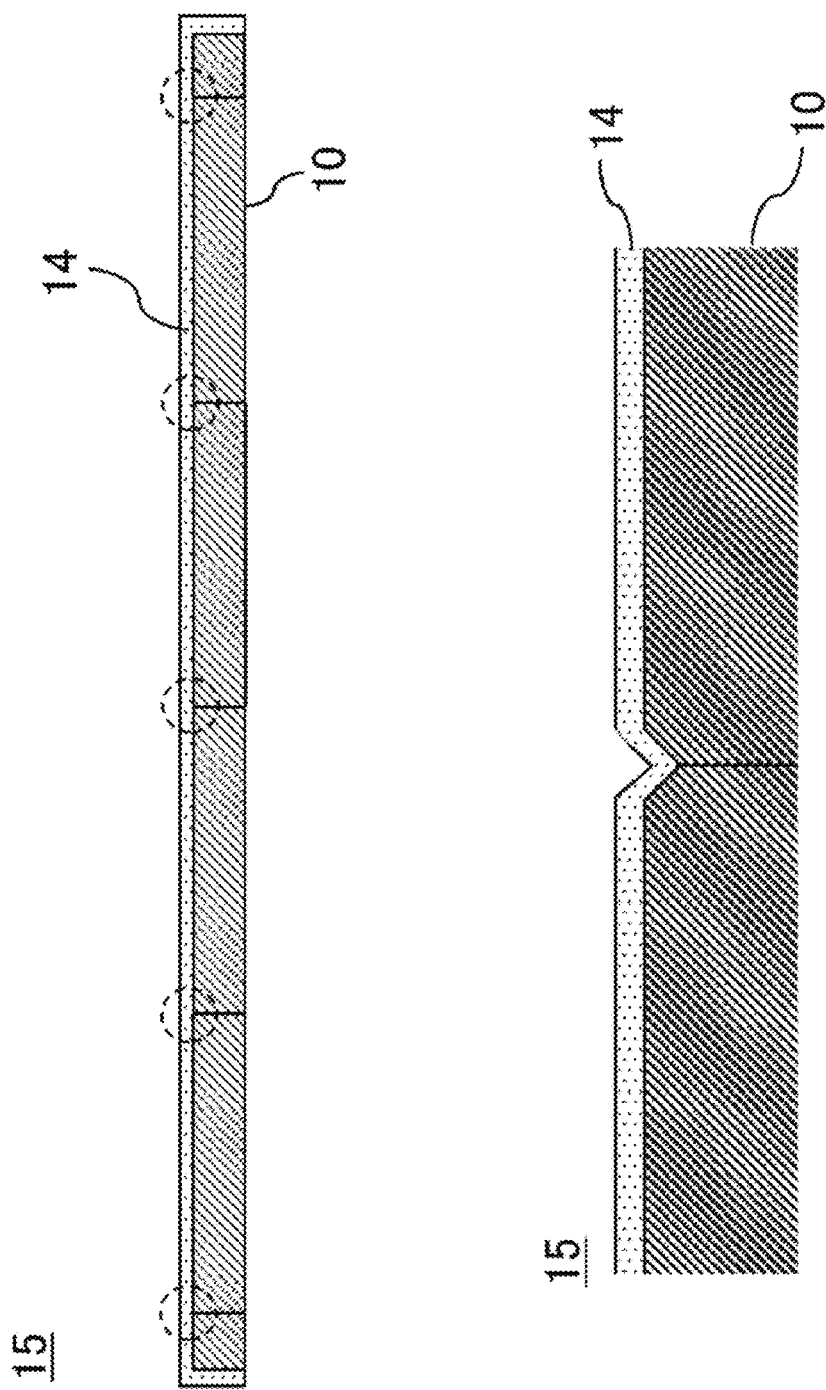
FIG. 4A is a cross-sectional view of a combined substrate obtained by vapor-phase growing the first crystal film on the seed crystal substrates.
FIG. 4B is an expanded cross-sectional view showing a state in which a V-groove is formed on a main surface of the combined substrate.

By growing the GaN crystal film 14 under the abovementioned conditions, the adjacent seed crystal substrates 10 are in a state in which they are combined with each other. However, the surface of the GaN crystal film 14 cannot be completely a smooth surface, and for example a V-shaped groove portion in cross-section (the groove portion is referred to as V-groove hereafter) is formed on the surface. FIG. 4B shows a state in which the V-groove is formed on the surface of the GaN crystal film 14. FIG. 4B is a partial expanded view of an area shown by broken lines in FIG. 4A. The V-groove is formed under an influence of a combined part of the seed crystal substrates 10, and is completely different from a so-called "pit" which is generated temporarily during a crystal growth, in the point that it is difficult to make such a V-groove disappear even if the vapor-phase growth in step 3 is continued for a long time. The pit is temporarily generated due to locally different crystal growth rates under the influence of a surface condition of a base surface, and even if it is generated, the pit can disappear by continuing the vapor-phase growth. On the other hand, the V-groove is generated due to a difference in crystal growth directions at the combined part of the seed crystal substrates 10, and a generation mechanism of the V-groove is completely different from that of the pit, and even if the vapor-phase growth is continued, it is difficult to make the V-groove disappear unlike the pit.

Thus, in step 3, it is difficult to make the V-groove formed at the combined part disappear, namely, it is difficult to completely smoothen the upper surface of the combined part, even if the vapor-phase growth is continued for a long time. Therefore, here, the vapor-phase growth is performed merely for the purpose of combining a plurality of seed crystal substrates 10 to set them so that they can be in a freestanding state, that is, merely for the purpose of temporarily fastening them, and processing is preferably moved to step 5 (liquid-phase growth step) described later as early as possible. In other words, the film thickness of the GaN crystal film 14 is preferably limited to a minimum necessary thickness for maintaining a combined state of the adjacent seed crystal substrates 10, that is, for maintaining the freestanding state of the combined substrate 15, even when the combined substrate 15 composed of the mutually combined seed crystal substrates 10 is removed from the holding plate 12 and subjected to cleaning, etc., in step 4 described later. Alternatively, the film thickness of the GaN crystal film 14 is preferably limited to a minimum necessary thickness for maintaining the combined state of the adjacent seed crystal substrates 10, that is, for maintaining the freestanding state of the combined substrate 15, even when the combined substrate 15 removed from the holding plate 12 is immersed in a raw material melt or in a raw material solution in step 5 described later.

The film thickness of the GaN crystal film 14 can be suitably selected from a film thickness band having a prescribed width, and in order to satisfy the abovementioned request, for example, a prescribed thickness in a range of 30D μM or more and 100D μm or less can be selected when an outer diameter of the combined substrate 15 is set to D cm. When the film thickness of the GaN crystal film 14 is less than 30D μM, the strength of combining the adjacent seed crystal substrates 10 is insufficient, and in steps 4 and 5 described later, the freestanding state of the combined substrate 15 cannot be maintained, and the step thereafter cannot be performed. Further, when the film thickness of the GaN crystal film 14 exceeds 100D μm, waste of various gases used for film formation, or reduction of productivity of the GaN substrate in total, is caused in some cases. When the outer diameter of the seed crystal substrate 10 is 2 inches and the outer diameter of the combined substrate 15 is 6 to 8 inches, the film thickness of the GaN crystal film 14 can be set in the thickness, for example, in a range of 450 μm or more and 2 mm or less.

(Step 4: Peeling of the Holding Plate and Cleaning)

When the growth of the GaN crystal film 14 is completed and the adjacent seed crystal substrates 10 are in the state in which they are combined with each other, supply of the HCl gas and the $H_2$ gas into the film-forming chamber 201, and heating by the heater 207, are respectively stopped in a state of supplying $NH_3$ gas and $N_2$ gas into the film-forming chamber 201 and exhausting the inside of the film-forming chamber 201. Then, after the temperature in the film-forming chamber 201 is 500° C. or less, supply of the $NH_3$ gas is stopped, and thereafter an atmosphere in the film-forming chamber 201 is substituted with $N_2$ gas, and is restored to the atmospheric pressure, and the temperature in the film-forming chamber 201 is lowered to a temperature for unloading the assembled substrate 13 therefrom. After such a temperature is lowered, the assembled substrate 13 is unloaded from the film-forming chamber 201. Then, the holding plate 12 is removed from the group of the plurality of seed crystal substrates 10 which are in a combined state. Thereafter, the adhesive agent 11, etc., adhered to the back side of the seed crystal substrates 10, is removed using a cleaning agent such as an aqueous hydrogen fluoride (HF), etc.

Through the above steps, the combined substrate 15 can be obtained, which is formed by combining the adjacent seed crystal substrates 10 by the GaN crystal film 14. As described above, by setting the film thickness of the GaN crystal film 14 as the abovementioned film thickness, the combined state of the adjacent seed crystal substrates 10, that is, the freestanding state of the combined substrate 15 can be maintained when the holding plate 12 is peeled-off and cleaning is performed. Also, as described above, formation of the V-groove is remained on the main surface of the combined substrate 15, that is, on the surface of the GaN crystal film 14 which is a crystal growth surface.

(Step 5: Liquid-Phase Growth Step)

Figure 5:
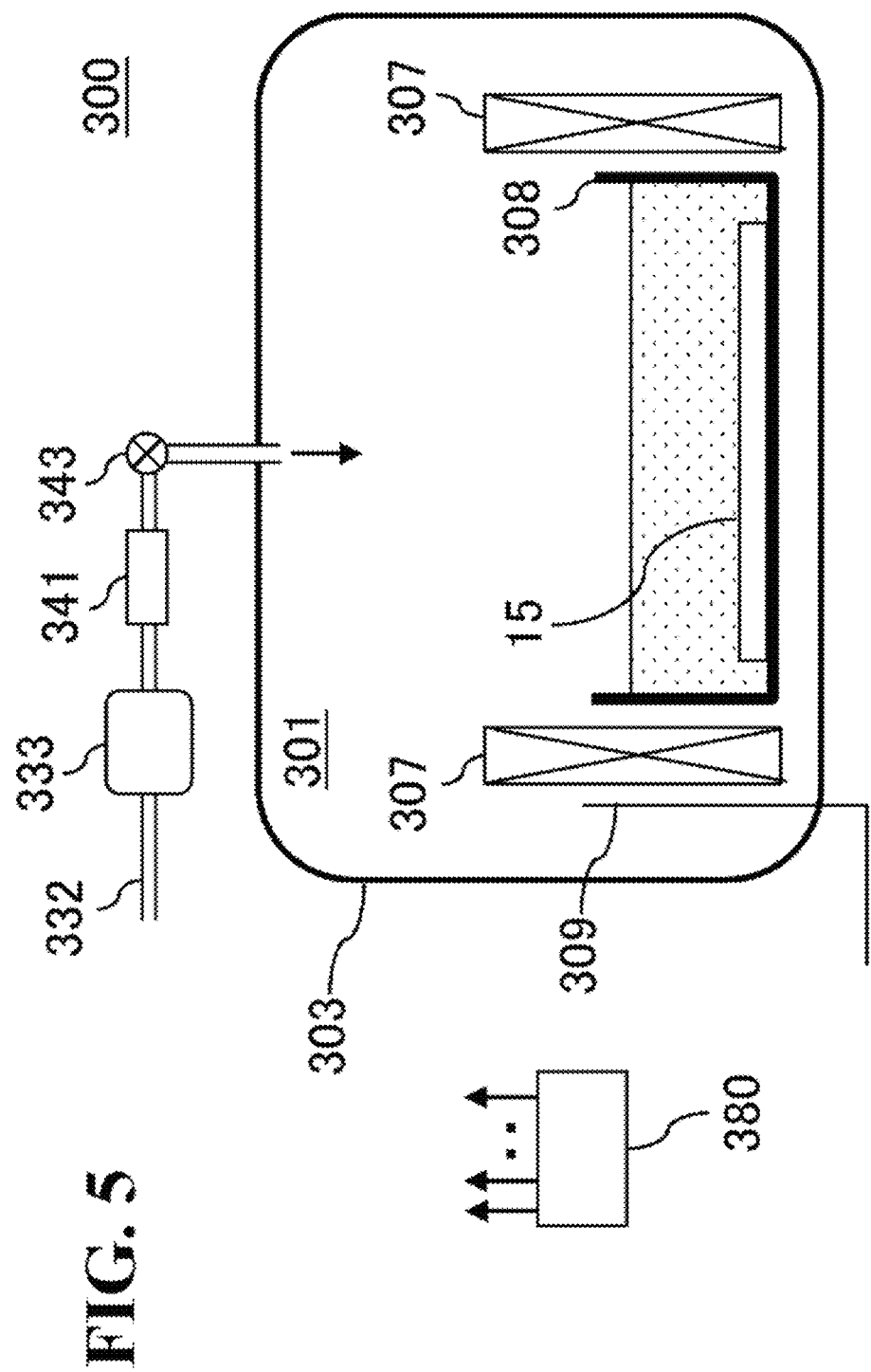
FIG. 5 is a schematic configuration view of a liquid-phase growth apparatus used when growing a second crystal film.

When the preparation of the combined substrate 15 is completed, a GaN crystal film 18 as a second crystal film (surface smoothened film) is grown on the main surface of the combined substrate 15, using a flux liquid-phase growth apparatus 300 shown in FIG. 5.

The flux liquid-phase growth apparatus 300 is made of stainless (SUS), etc., and includes a pressure-resistant container 303 having a pressurizing chamber 301 therein. The inside of the pressurizing chamber 301 is configured so that a pressure can be raised in a high pressure state of about 5 MPa for example. In the pressurizing chamber 301, there are provided a crucible 308, a heater 307 for heating the inside of the crucible 308, and a temperature sensor 309 for measuring the temperature of the inside of the pressurizing chamber 301. The crucible 308 is configured so that the Ga solution (raw material solution) can be contained therein, in which for example sodium (Na) is used as a solvent (flux), and the abovementioned combined substrate 15 can be immersed in the raw material solution, with the main surface (crystal growth surface) faced upward. A gas supply pipe 332 is connected to the pressure-resistant container 303, for supplying $N_2$ gas or $NH_3$ gas (or mixed gas of them) into the pressurizing chamber 301. A pressure control device 333, a flow rate controller 341, and a valve 343 are provided on the gas supply pipe 332 sequentially from the upstream side. Each member provided in the flux liquid-phase growth apparatus 300, is connected to a controller 380 configured as a computer, and is configured to control processing procedures and processing conditions described later, by a program executed by the controller 380.

Figure 6A:
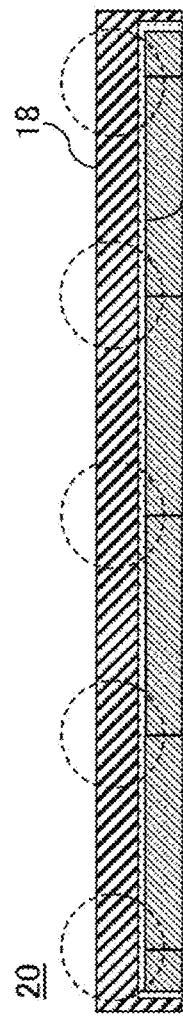
FIG. 6A is a cross-sectional view of a substrate for crystal growth obtained by liquid-phase growing the second crystal film on the combined substrate.

Step 5 can be performed using the abovementioned flux liquid-phase growth apparatus 300, for example based on the following processing procedures. First, the combined substrate 15 and raw materials (Na crystal and Ga crystal) are put in the crucible 308, and the pressure-resistant container 303 is sealed. Then, a raw material solution (Ga solution using Na as a medium) is produced in the crucible 308 by starting heating by the heater 307, thus creating a state in which the combined substrate 15 is immersed in the raw material solution. In this state, $N_2$ gas (or mixed gas of $NH_3$ gas and $N_2$ gas) is supplied into the pressurizing chamber 301 and nitrogen (N) is dissolved in the raw material solution, and such a state is maintained for a prescribed time. In this manner, GaN crystal is epitaxially grown on the main surface of the combined substrate 15, namely, on the surface of the GaN crystal film 14, to thereby form a GaN crystal film 18. FIG. 6A shows a cross-sectional configuration view of the crystal growth substrate 20, which is formed by the growth of the GaN crystal film 18 on the main surface of the combined substrate 15. After the growth of the GaN crystal film 18 is completed, the inside of the pressure-resistant container 303 is restored to the atmospheric pressure, and the crystal growth substrate 20 is taken out from the crucible 308.

Step 5 is performed based on the following processing conditions for example:

Film-forming temperature (temperature of the raw material solution): 600 to 1200° C., and preferably 800 to 900° C.

Film-forming pressure (pressure in the pressurizing chamber): 0.1 Pa to 10 MPa, and preferably 1 MPa to 6 MPa Ga concentration in the raw material solution [Ga/(Na+Ga)]: 5 to 70%, and preferably 10 to 50%

Figure 6B:
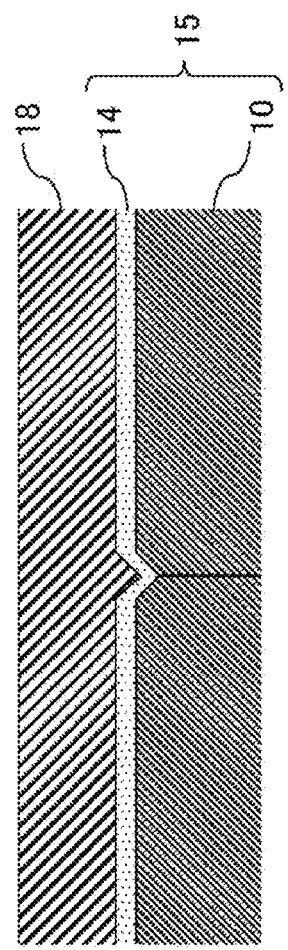
FIG. 6B is an expanded cross-sectional view showing a state in which a main surface of the substrate for crystal growth is smoothed by embedding the second crystal film in the V-groove.

Owing to the growth of the GaN crystal film 18 under the abovementioned conditions, the GaN crystal is grown in the groove that exists at the combined part of the seed crystal substrates 10, that is, in the V-groove formed on the surface of the GaN crystal film 14, and the GaN crystal film 18 can be embedded in the V-groove. As a result, the V-groove can disappear, and the crystal growth substrate 20 having a smoothened main surface can be prepared. FIG. 6B shows a state in which the GaN crystal film 18 is embedded in the V-groove. The main surface of the crystal growth substrate 20 (the surface of the GaN crystal film 18) is used as a base surface for crystal growth, and may be sometimes distributed to the market in this state as a seed substrate.

It should be noted that the disappearance of the V-groove by embedding the GaN crystal therein is difficult when the vapor-phase growth method such as HVPE method, etc., is used as described above. By using the liquid-phase growth method such as a Na flux method, the V-groove can be made to disappear. In this case, as shown in this embodiment, the V-groove can completely disappear by setting the following state: all lateral surfaces of the seed crystal substrates 10 in contact with the lateral surfaces of other seed crystal substrates 10 are the planes excluding M-plane, and the planes in the same orientation each other. For example, the V-groove can completely disappear and the surface of the crystal growth substrate 20 can be completely smoothened by combining the adjacent seed crystal substrates 10 by a-planes, rather than by combining the adjacent seed crystal substrates 10 by M-planes for example.

In addition, the following method is also conceivable: the liquid-phase growth of step 5 is continued after making the V-groove disappear, so that the GaN crystal film 18 is grown in a thickness of about 1 to 20 mm for example, and thereafter such a thick grown GaN crystal film 18 is sliced, to thereby obtain a plurality of GaN substrates. However, in the liquid-phase growth method such as Na flux method, a film-forming rate (crystal growth rate) is smaller than that of the vapor-phase growth method such as HVPE method, etc., and a considerable amount of time is required to complete its manufacture, for obtaining a final GaN substrate by continuing the liquid-phase growth. Therefore, here the liquid-phase growth is performed merely for the purpose of causing disappearance of the V-groove formed on the main surface of the GaN crystal film 14, that is, merely for the purpose of smoothing the main surface of the crystal growth substrate 20, and the processing is preferably moved to the subsequent step 6 (vapor-phase growth step) as early as possible. In other words, the film thickness of the GaN crystal film 18 is preferably limited to a minimum necessary thickness for smoothing the main surface of the crystal growth substrate 20 by embedding the GaN crystal film 18 in the V-groove.

The film thickness of the GaN crystal film 18 can be suitably selected according to the abovementioned purposes, from the film thickness band having a prescribed width. In order to completely make the V-groove disappear, the thickness of the GaN crystal film 18 can be set to a prescribed thickness, for example, in a range of 0.8 times or more and 1.2 times or less of the size of the V-groove (larger one of a depth or an opening width). When the film thickness of the GaN crystal film 18 is too small, disappearance of the V-groove becomes sometimes insufficient. When the film thickness of the GaN crystal film 18 is too large, a surface morphology state of the GaN crystal film 18 is deteriorated, and remarkable Na inclusion phenomenon occurs on the surface in which Na used as a flux is incorporated into the surface of the GaN crystal film 18. When the film thickness of the GaN crystal film 18 is too large, waste of the raw material solution or various gases used for film formation, or reduction of productivity of the GaN substrate in total as a final product, is caused in some cases. When the depth or the opening width of the V-groove is about 200 μm, the film thickness of the GaN crystal film 18 can be set in the thickness, for example, in a range of 160 μm or more and 240 μm or less.

Figure 8A:
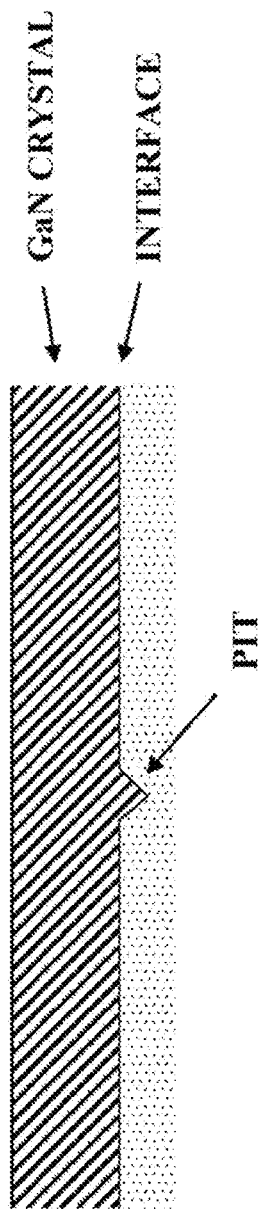
FIG. 8A is an expanded cross-sectional view showing an example of the crystal growth on an interface.
Figure 8B:
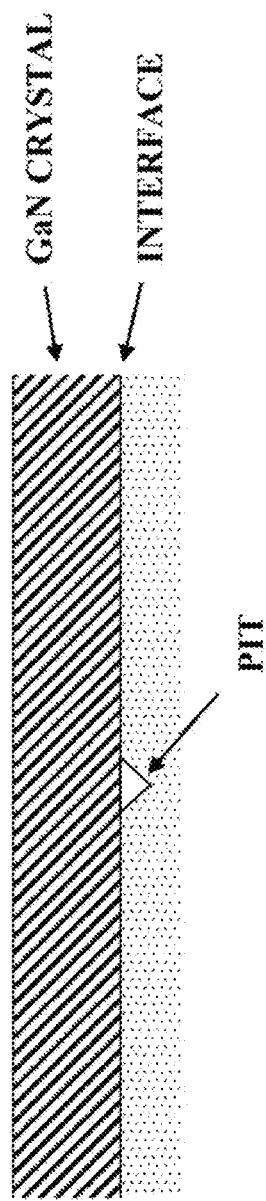
FIG. 8B is an expanded cross-sectional view showing a modified example of the crystal growth on the interface.
Figure 8C:
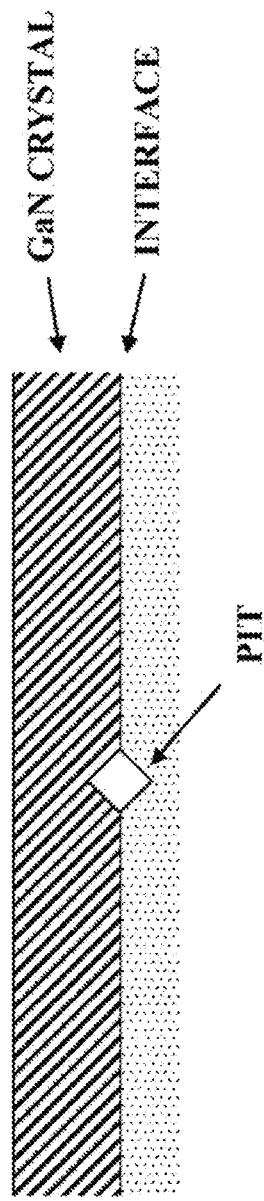
FIG. 8C is an expanded cross-sectional view showing a modified example of the crystal growth on the interface.

In this embodiment, the Na flux method is used as the liquid-phase growth method. However, in this case, Na used as a flux is sometimes incorporated into a pit or the like that exists on the interface between the GaN crystal film 14 and the GaN crystal film 18. This is because as shown in FIG. 8A, when the GaN crystal grows so as to embed the inside of the pit, Na is hardly incorporated into the pit. However, as shown in FIG. 8B, when the pit is sealed due to a rapid lateral growth of the GaN crystal above the pit, or as shown in FIG. 8C, when the pit is sealed due to a gradual lateral growth of the GaN crystal above the pit, Na is easily incorporated into the pit. Particularly, when the crystal grows as shown in FIG. 8C, an amount of Na incorporated into the pit is likely to be increased.

Figure 6C:
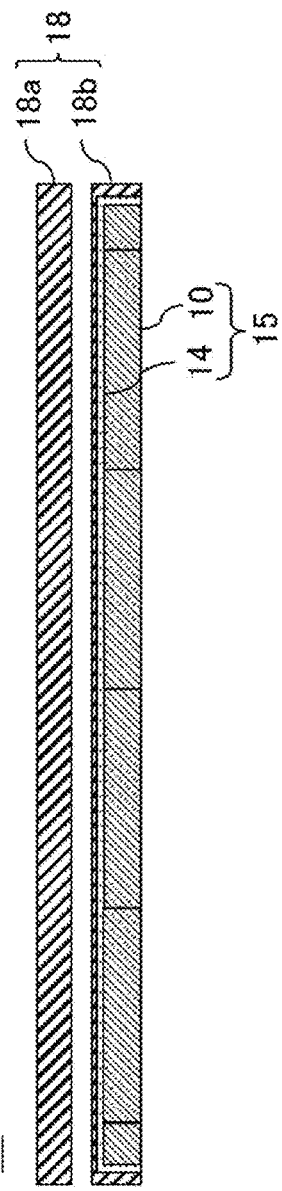
FIG. 6C is a pattern diagram showing a case in which a portion having a desired impurity concentration is cut out from the second crystal film, which is then used as the substrate for crystal growth.

Burst of Na incorporated into the interface occurs when the crystal growth substrate 20 is heated in the step 6 (vapor-phase growth step) performed thereafter, which may damage the GaN crystal film 18 in some cases. Therefore, in this embodiment, as shown in FIG. 6C, a layer 18a having a low Na-containing concentration in the GaN crystal film 18 is cut out, and this layer 18a is used as the crystal growth substrate 20. According to the studies of the inventors, it is known that an area into which Na is incorporated at a high concentration is limited only to the periphery of the interface. For example, when the size (larger one of the depth or the opening width) of the pit that exists on the interface is about 3 μm, it is known that an area into which Na is incorporated at a high concentration, is limited to an area within a range of 2.5 μm from the interface. Therefore, when the layer 18a is cut out from the GaN crystal film 18 and a cutout surface thereof is polished or the like, almost no Na is included in the layer 18a (crystal growth substrate 20).

When the abovementioned cutout process is performed, the film thickness of the GaN crystal film 18 is preferably set to a thickness such as enabling the layer 18a to be cut out as one substrate, that is, set to a thickness that allows the cutout layer 18a to be maintained in a freestanding state. By setting the film thickness of the GaN crystal film 18 to 0.5 mm or more for example, and preferably 1 mm or more, the layer 18a can be cut out and set in the freestanding state. In this case, the crystal growth substrate 20 does not include the seed crystal substrates 10, but under an influence of the combined part of the seed crystal substrates 10, the crystal growth substrate 20 (layer 18a) has a high defect area in which defect density and internal distortion are relatively larger, that is, has an area in which strength and quality are relatively deteriorated. The high defect area has a larger defect density (internal distortion) than an average defect density (or internal distortion) in the GaN crystal film 18. The existence of such a high defect area can be sometimes observed visually due to the formation of grooves or steps on the surface, or cannot be observed visually in some cases. Even when it cannot be observed visually, the existence of the high defect area can be recognized by using a publicly-known analysis technique such as X-ray diffraction, etc.

Here, explanation is given for a case in which the layer 18a having a small Na-containing concentration is cut out and used as the crystal growth substrate 20, but this embodiment is not limited to such a mode. This is because in the Na flux method, the crystal growth in a lateral direction (in a direction orthogonal to the c-axis) of the GaN crystal can be promoted, by appropriately selecting the processing conditions. Accordingly, the amount of Na incorporated into the interface can be suppressed.

For example, the crystal growth in the direction orthogonal to the c-axis can be promoted by setting a molar ratio (Ga/Na) of Ga with respect to Na to be small in the raw material solution contained in the crucible 308. Thus, the crystal growth type shown in FIG. 8C is suppressed, and the ratio of the crystal growth type shown in FIG. 8A or FIG. 8B is increased, and the amount of Na incorporated into the interface can be considerably reduced. In this case, the substrate shown in FIG. 6A can be used as the crystal growth substrate 20 without cutting out the layer 18a from the GaN crystal film 18, that is, in an integral state of the GaN crystal film 18 and the seed crystal substrates 10. When the size of the V-groove is about 200 μm, the film thickness of the GaN crystal film 18 can be set to the thickness, for example, in a range of 160 μm or more and 240 μm or less as described above.

Promotion of the crystal growth in the direction orthogonal to the c-axis can also be performed not only by the abovementioned molar ratio, but also, for example by a film-forming pressure. For example, by setting the pressure inside of the pressurizing chamber 301 to a high pressure and setting the temperature therein to a low temperature, the amount of N incorporated into the raw material solution is increased (the degree of supersaturation is increased), and the crystal growth of the GaN crystal in the direction orthogonal to the c-axis can be promoted. Further, by setting the pressure inside of the pressurizing chamber 301 to a low pressure and setting the temperature therein to a high temperature, the amount of N incorporated into the raw material solution is decreased (the degree of supersaturation is decreased), and the crystal growth of the GaN crystal in the c-axis direction can be promoted. For example, by setting the film-forming pressure to 3 MPa to 5 MPa, and preferably set to about 4 MPa, the crystal growth in the direction orthogonal to the c-axis can be promoted, and the effect similar to above can be obtained.

Further, promotion of the crystal growth in the direction orthogonal to the c-axis can also be performed by a stirring direction of the raw material solution for example. By setting the stirring direction of the raw material solution to a lateral direction, the crystal growth in the direction orthogonal to the c-axis can be promoted, and the effect similar to above can be obtained.

These methods can be used arbitrarily in combination. The processing conditions such as the film-forming pressure and the temperature, etc., may be changed according to a progress of the film-formation processing. For example, the pressure may be increased or the temperature may be lowered for promoting the crystal growth in the direction orthogonal to the c-axis in the initial stage of the growth of the GaN crystal film 18, and the pressure may be reduced or the temperature may be raised for promoting the crystal growth in the c-axis in the stage of a middle state of growth or thereafter.

(Step 6: Vapor-Phase Growth and Slicing)

Figure 7A:
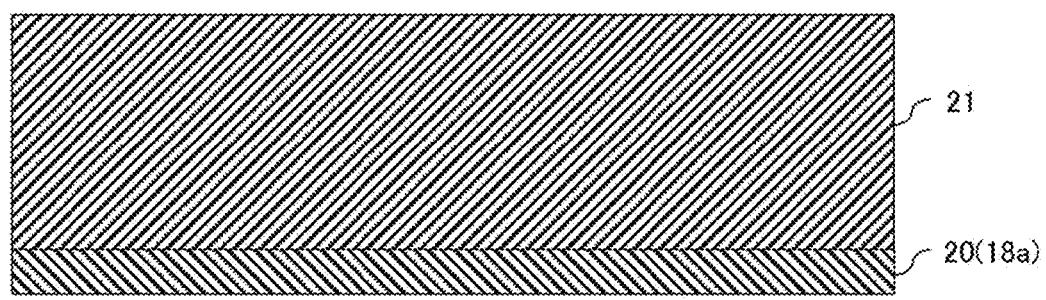
FIG. 7A is a cross-sectional configuration view showing a state in which the third crystal film is vapor-phase grown on the main surface of the substrate for crystal growth.

When the preparation of the crystal growth substrate 20 is completed, a GaN crystal film 21 as a third crystal film (full-scale growth film) is grown on the smoothened main surface of the crystal growth substrate 20, by the processing procedure similar to that of step 3, using the HVPE apparatus 200 shown in FIG. 3. FIG. 7A shows a state in which the GaN crystal film 21 is formed thick on the smoothened main surface of the crystal growth substrate 20, that is, on the main surface of the GaN crystal film 18 by the vapor-phase growth method.

Processing conditions in step 6 can be the same as the abovementioned processing conditions in step 3, but it is preferable to make the processing conditions different between them. This is because the film-formation processing in step 3 is performed for the main purpose of combining the seed crystal substrates 10. Therefore, in step 3, it is preferable to grow the crystal under a condition that emphasizes the growth in a direction along the main surface (c-plane) (direction orthogonal to the c-axis), rather than the growth toward the main surface direction (c-axis direction). On the other hand, the film-formation processing in step 6 is performed for the main purpose of growing the GaN crystal film 21 thick on the crystal growth substrate 20 at a high speed. Therefore, in step 6, it is preferable to grow the crystal under a condition that emphasizes the growth toward the c-axis direction rather than the growth toward the direction orthogonal to the c-axis.

As a method for achieving the abovementioned purposes, for example, there is a method of making a different atmosphere in the film-forming chamber 201 between step 3 and step 6. For example, the ratio ($H_2/N_2$) of a partial pressure of $H_2$ gas to a partial pressure of $N_2$ gas in the film-forming chamber 201 in step 6, is set to be smaller than the ratio ($H_2/N_2$) of a partial pressure of $H_2$ gas to a partial pressure of $N_2$ gas in the film-forming chamber 201 in step 3. As a result, the crystal growth toward the direction orthogonal to the c-axis becomes relatively active in step 3, and the crystal growth toward the c-axis direction becomes relatively active in step 6.

As another method for achieving the abovementioned purposes, for example, there is a method of making a different film-forming temperature between step 3 and step 6. For example, the film-forming temperature in step 6 is set to be lower than the film-forming temperature in step 3. As a result, the crystal growth toward the direction orthogonal to the c-axis becomes relatively active in step 3, and the crystal growth toward the c-axis direction becomes relatively active in step 6.

As still another method for achieving the abovementioned purposes, for example, there is a method of making a different ratio ($NH_3/GaCl$) of the supply flow rate of the $NH_3$ gas to the supply flow rate of the GaCl gas between step 3 and step 6. For example, the ratio of $NH_3/GaCl$ in step 6 is set to be larger than the ratio of $NH_3/GaCl$ in step 3. As a result, the crystal growth toward the direction orthogonal to the c-axis becomes relatively active in step 3, and the crystal growth toward the c-axis direction becomes relatively active in step 6.

Step 6 is performed based on the following processing conditions for example:

Film-forming temperature (temperature of the assembled substrate): 980 to 1100° C.

Film-forming pressure (pressure in the film-forming chamber): 90 to 105 kPa, and preferably 90 to 95 kPa Partial pressure of GaCl gas: 1.5 to 15 kPa Partial pressure of $NH_3$ gas/partial pressure of GaCl gas: 4 to 20

Flow rate of $H_2$ gas/flow rate of $N_2$ gas: 1 to 20

Figure 7B:
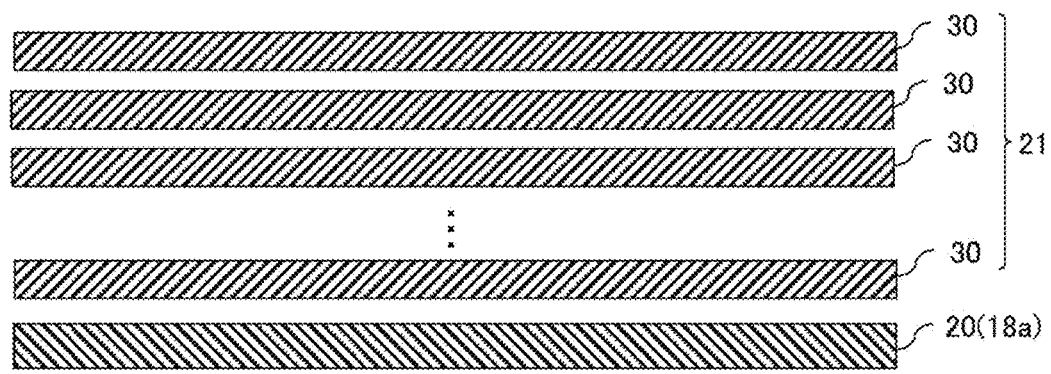
FIG. 7B is a pattern diagram showing a state in which a plurality of nitride crystal substrates are obtained by cutting out the third crystal film.

After growth of the GaN crystal film 21, the film-formation processing is stopped by the processing procedure similar to the processing procedure at the end of step 3, and the crystal growth substrate 20 with the GaN crystal film 21 formed thereon, is unloaded from the film-forming chamber 201. Thereafter, the GaN crystal film 21 is sliced, so that one or more GaN substrates 30 can be obtained as shown in FIG. 7B. Also, an entire lamination structure of the crystal growth substrate 20 and the GaN crystal film 21 can be regarded as a GaN substrate. When the crystal growth substrate 20 is cut out from the GaN crystal film 21, step 6 can be performed again using the cutout crystal growth substrate 20, that is, the cutout crystal growth substrate 20 can be reused.

(2) Effect Obtained by this Embodiment

According to this embodiment, one or a plurality of effects shown below can be obtained.

Figure 9A:
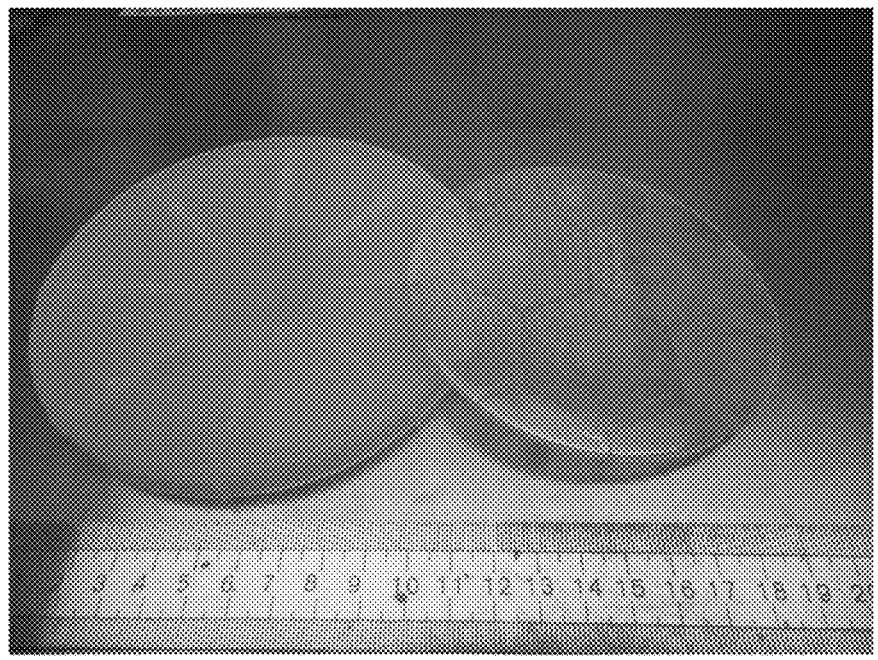
FIG. 9A is a photograph showing a configuration example of the combined substrate formed by combining a plurality of seed crystal substrates.

(a) By matching a plurality of seed crystal substrates 10 with relatively small diameters, the outer diameter and the shape of the crystal growth substrate 20 can be arbitrarily changed. In this case, even when the diameter of the crystal growth substrate 20 is increased, increase of the variation of the off-angle in its main surface can be suppressed. For example, the variation of the off-angle in the main surface of the entire crystal growth substrate 20 can be equal to or less than the variation of the off-angle in the main surface of each seed crystal substrate 10. In this manner, by using a crystal growth substrate 20 with a large diameter with less variation of off-angle, high-quality GaN substrate 30 can be manufactured. FIG. 9A is a photograph showing a configuration example of the combined substrate obtained by matching a plurality of regular hexagonal seed crystal substrates. The diameter of the combined substrate shown here is about 10 cm, and it is already confirmed that the variation of the off-angle in the main surface of the entire crystal growth substrate prepared using the combined substrate, is equal to or less than the variation of the off-angle in the main surface of each seed crystal substrate constituting the combined substrate. Thus, it can be said that the substrate for crystal growth with a large diameter with less variation of off-angle, is the substrate which is difficult to be manufactured without a knowledge as exemplified in this embodiment.

(b) By vapor-phase growing the GaN crystal film 14 and combining the seed crystal substrates 10, that is, by combining the seed crystal substrates 10 using a film having the same material and having the same composition as the material and the composition of the film to be subjected to the liquid-phase growth in step 5, the GaN crystal film 14 is hardly melted even when the liquid-phase growth step is performed in step 5, and the seed crystal substrates 10 hardly come off form their combination. Further, even if a part of the GaN crystal film 14 is dissolved in the raw material solution, the influence on the crystallinity of the GaN crystal film 18 grown in step 5, can be prevented.

On the other hand, for example, when step 5 (liquid-phase growth step) is performed without performing step 3 (combination by vapor-phase growth) after steps 1 and 2 are performed, the adhesive agent 11 is dissolved into the raw material solution in the process of the liquid-phase growth, and the seed crystal substrates 10 come off from the holding plate 12, or the crystallinity, etc., of the GaN crystal film 18 is deteriorated under influence of the dissolved adhesive agent 11 in some cases.

(c) Instead of manufacturing the GaN substrate 30 only through the vapor-phase growth step of step 3 and step 6, step 5 (liquid-phase growth step) is interposed in the middle of step 3 and step 6, thereby making it possible to completely make the V-groove disappear from the surface of the crystal growth substrate 20. As a result, high quality GaN substrate 30 can be manufactured with no necessity for passing through extra steps of stopping the vapor-phase growth of the GaN crystal film in the middle and cutting the surface of the grown GaN crystal film or the like. Further, the number of screw dislocations included in the GaN substrate 30 can be reduced by interposing step 5 between step 3 and step 6. This is because when the combined substrate 15 is immersed in the raw material solution in step 5, a part of the surface of the GaN crystal film 14 which is the base of the crystal growth is melt-backed, and the screw dislocation included therein is removed.

In contrast, for example when step 6 (vapor-phase growth step) is performed without performing step 5 (liquid-phase growth step), etc., after steps 1 to 3 are performed, the GaN crystal film 21 formed in step 6 is exposed to a great influence of the V-groove formed on the surface of the GaN crystal film 14, thereby deteriorating the crystallinity, etc., of the GaN substrate 30 in some cases. Further, in order to cut off the influence of the V-groove, there is a new necessity for stopping step 6 in the middle, and cutting the surface of the GaN crystal film 21 or the like, and thereafter restarting step 6. In this case, productivity is reduced in some cases.

(d) The liquid-phase growth in step 5 is performed for the main purpose of making the V-groove disappear, the V-groove being formed on the surface of the GaN crystal film 14, and a full-scale growth of the thick film is performed in the vapor-phase growth step of step 6. Productivity of the GaN substrate 30 can be improved because the film-formation rate is larger in the vapor-phase growth than that of the liquid-phase growth. On the other hand, when the thick film is grown by continuing step 5 for a long time after steps 1 to 4 are performed, reduction of the productivity is caused in some cases as described above.

Figure 9B:
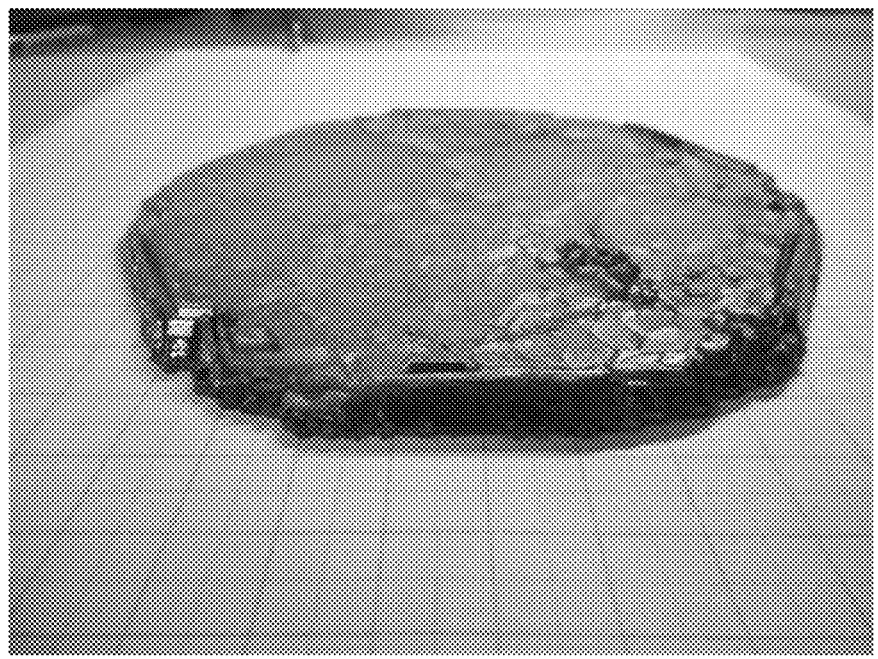
FIG. 9B is a photograph showing a configuration example of the substrate for crystal growth obtained by making the V-groove disappear by a liquid-phase growth processing, the V-groove being formed on the main surface of the combined substrate.

(e) By forming all surfaces of the lateral surfaces of the seed crystal substrates 10 in contact with the lateral surfaces of other seed crystal substrates 10 as the planes excluding M-plane and as the planes having the same orientation each other, the V-groove formed on the surface of the GaN crystal film 14 can completely disappear when step 5 (liquid-phase growth step) is performed. For example, by combining the adjacent seed crystal substrates 10 by the a-planes, the V-groove can more completely disappear than a case of combining them by the M-planes. FIG. 9B is a photograph showing a configuration example of the crystal growth substrate obtained by making the V-groove disappear by performing step 5. The crystal growth substrate with a large diameter having such a smoothened main surface, can be said as the substrate that can be hardly manufactured unless there is the knowledge exemplified in this embodiment.

Other Embodiment

As described above, embodiments of the present invention have been described specifically. However, the present invention is not limited to the abovementioned embodiments, and can be variously modified in a range not departing from the gist of the invention.

For example, in the abovementioned embodiment, explanation is given for a case of using the Hydride Vapor-phase Epitaxy (HVPE) method as the vapor-phase growth method in steps 3 and 6. However, the present invention is not limited to such a mode. For example, in either one or both of steps 3 and 6, the vapor-phase growth method other than HVPE method, such as metal organic chemical vapor deposition (MOCVD) method and oxide vapor-phase epitaxy (OVPE) method, etc., may be used. In this case as well, the same effect as the effect of the abovementioned embodiment can be obtained.

Further for example, in the abovementioned embodiment, explanation is given for a case of performing the liquid-phase growth in step 5 by the flux method in which Na is used as flux. However, the present invention is not limited to such a mode. For example, alkali metal other than Na, such as lithium (Li), etc., may be used as the flux. Further, the liquid-phase growth may be performed using a method other than the flux method, such as a melt growth method performed under high pressure and high temperature or an ammonothermal method, or the like. In these cases as well, the same effect as the effect of the abovementioned embodiment can be obtained.

Further for example, in the abovementioned embodiment, explanation is given for a case of adhering the holding plate 12 and the seed crystal substrates 10 using the adhesive agent 11. However, the present invention is not limited to such a mode. For example, a substrate made of GaN polycrystal (GaN polycrystalline substrate) may be used as the holding plate 12, and the holding plate 12 and the seed crystal substrates 10 may be directly adhered without using the adhesive agent 11. For example, by plasma-treating the surface of the holding plate 12 made of GaN polycrystal, its main surface is terminated with OH group and thereafter the seed crystal substrates 10 are directly placed on the main surface of the holding plate 12, so that they can be adhered integrally. Then, by applying annealing to a laminate formed by adhering the holding plate 12 and the seed crystal substrates 10, moisture, etc., remained between the holding plate 12 and the seed crystal substrates 10 can be removed, and such a laminate can be suitably used as the abovementioned assembled substrate 13 or as the combined substrate 15.

The present invention is not limited to GaN, and can be suitably applied to a case when manufacturing a substrate made of a nitride crystal such as aluminum nitride (AlN), aluminum gallium nitride (AlGaN), indium nitride (InN), indium gallium nitride (InGaN), and aluminum indium gallium nitride (AlInGaN), etc., that is, made of a nitride crystal represented by a composition formula of $Al_xIn_yGa_{1-x-y}N$ ($0 \leq x+y \leq 1$).

Preferred Aspects of the Present Invention

Preferred aspects of the present invention will be supplementarily described hereafter.

Supplementary Description 1

There is provided a method for manufacturing a nitride crystal substrate, including:

arranging a plurality of seed crystal substrates made of a nitride crystal in a planar appearance, so that their main surfaces are parallel to each other and their lateral surfaces are in contact with each other;

growing a first crystal film using a vapor-phase growth method on a surface of the plurality of seed crystal substrates arranged in the planar appearance, and preparing a combined substrate formed by combining the adjacent seed crystal substrates each other by the first crystal film;

growing a second crystal film using a liquid-phase growth method on a main surface of the combined substrate so as to be embedded in a groove that exists at a combined part of the seed crystal substrates, and preparing a substrate for crystal growth having a smoothened main surface; and growing a third crystal film using the vapor-phase growth method, on the smoothened main surface of the substrate for crystal growth Supplementary Description 2

There is provided the method for manufacturing a nitride crystal substrate according to supplementary description 1, wherein the seed crystal substrates are made of GaN crystals, the main surface of the seed crystal substrates is a c-plane, and all lateral surfaces of the seed crystal substrates in contact with lateral surfaces of other seed crystal substrates are a-planes.

Supplementary Description 3

There is provided the method for manufacturing a nitride crystal substrate according to supplementary description 1 or 2, wherein preparing the combined substrate is performed in a state of holding (adhering, bonding) the plurality of seed crystal substrates on a holding plate, a thickness of the first crystal film is set to a minimum necessary thickness for maintaining a combined state of the adjacent seed crystal substrates (freestanding state of the combined substrate) even when the combined substrate is removed from the holding plate.

Supplementary Description 4

There is provided the method for manufacturing a nitride crystal substrate according to the supplementary description 3, wherein the thickness of the first crystal film is set to a minimum necessary thickness for maintaining a combined state of the adjacent seed crystal substrates, even when the combined substrate removed from the holding plate is immersed in a raw material melt or a raw material solution when preparing the substrate for crystal growth.

Supplementary Description 5

There is provided the method for manufacturing a nitride crystal substrate according to any one of the supplementary descriptions 1 to 4, wherein when an outer diameter of the combined substrate is set to D cm, the thickness of the first crystal film is set in a range of 30D μm or more and 100D μm or less.

Supplementary Description 6

There is provided the method for manufacturing a nitride crystal substrate according to any one of the supplementary descriptions 1 to 5, wherein a thickness of the second crystal film is set to a minimum necessary thickness for smoothing the main surface of the substrate for crystal growth by embedding the second crystal film in the groove.

Supplementary Description 7

There is provided the method for manufacturing a nitride crystal substrate according to any one of the supplementary descriptions 1 to 6, wherein the second crystal film is formed on the surface of the combined substrate on the side where the first crystal film is formed.

Supplementary Description 8

There is provided the method for manufacturing a nitride crystal substrate according to any one of the supplementary descriptions 1 to 7, wherein the first crystal film and the third crystal film are grown using a vapor-phase growth method which is Hydride Vapor-phase Epitaxy method, and different processing conditions are set between when growing the first crystal film, and when growing the third crystal film.

Supplementary Description 9

There is provided a crystal growth substrate, including:
a plurality of seed crystal substrates made of a nitride crystal, arranged in a planar appearance, so that their main surfaces are parallel to each other and their lateral surfaces are in contact with each other;
a first crystal film formed using a vapor-phase growth method on a surface of the plurality of seed crystal substrates arranged in the planar appearance, and configured to combine the adjacent seed crystal substrates each other; and
a second crystal film formed using a liquid-phase growth method on a main surface of the plurality of seed crystal substrates on which the first crystal film is formed, and having a smoothened main surface by being embedded in a groove that exist at a combined part of the seed crystal substrates.

What is claimed is:

1. A method for manufacturing a nitride crystal substrate, comprising: arranging a plurality of seed crystal substrates made of a nitride crystal in a planar appearance, so that their main surfaces are parallel to each other and their lateral surfaces are in contact with each other; growing a first crystal film using a vapor-phase growth method on a surface of the plurality of seed crystal substrates arranged in the planar appearance, and preparing a combined substrate formed by combining the adjacent seed crystal substrates with each other by the first crystal film; growing a second crystal film using a liquid-phase growth method on a main surface of the combined substrate so as to be embedded in a groove that exists at a combined part of the seed crystal substrates, and preparing a substrate for crystal growth having a smoothened main surface, wherein a thickness of the second crystal film is set to a minimum necessary thickness to grow the smoothened main surface of the substrate for crystal growth by embedding the second crystal film in the groove; and growing a third crystal film using the vapor-phase growth method, on the smoothed main surface of the substrate for crystal growth.

2. The method for manufacturing a nitride crystal substrate according to claim 1, wherein the seed crystal substrates are made of GaN crystals, the main surface of the seed crystal substrates is a c-plane, and all lateral surfaces of the seed crystal substrates in contact with lateral surfaces of other seed crystal substrates are a-planes.

3. The method for manufacturing a nitride crystal substrate according to claim 1, wherein preparing the combined substrate is performed in a state of holding the plurality of seed crystal substrates on a holding plate, a thickness of the first crystal film is set to a minimum necessary thickness for maintaining a combined state of the adjacent seed crystal substrates even when the combined substrate is removed from the holding plate.

4. The method for manufacturing a nitride crystal substrate according to claim 3, wherein the thickness of the first crystal film is set to a minimum necessary thickness for maintaining a combined state of the adjacent seed crystal substrates, even when the combined substrate removed from the holding plate is immersed in a raw material melt or a raw material solution when preparing the substrate for crystal growth.

5. The method for manufacturing a nitride crystal substrate according to claim 1, wherein when an outer diameter of the combined substrate is set to D cm, the thickness of the first crystal film is set in a range of 30D μm or more and 100D μm or less.

6. The method for manufacturing a nitride crystal substrate according to claim 1, wherein the second crystal film is formed on the surface of the combined substrate on the side where the first crystal film is formed.

7. The method for manufacturing a nitride crystal substrate according to claim 1, wherein the first crystal film and the third crystal film are grown using a vapor-phase growth method which is Hydride Vapor-phase Epitaxy method, and different processing conditions are set between when growing the first crystal film, and when growing the third crystal film.

8. The method for manufacturing a nitride crystal substrate according to claim 1, wherein the second crystal film is set to have a prescribed thickness in a range of 0.8 times or more and 1.2 times or less of a size of a larger one of a depth or an opening width of the groove.

9. The method for manufacturing a nitride crystal substrate according to claim 1, wherein the third crystal film is set to be thick enough to obtain a plurality of nitride crystal substrates from the third crystal film.

\* \* \* \* \*